(12) United States Patent
Watanabe et al.

(10) Patent No.: US 9,992,918 B2
(45) Date of Patent: Jun. 5, 2018

(54) METHOD FOR MOUNTING ELECTRONIC COMPONENT

(71) Applicant: Panasonic Intellectual Property Management Co., Ltd., Osaka (JP)

(72) Inventors: Hideaki Watanabe, Yamanashi (JP); Kiyoshi Imai, Yamanashi (JP); Shigeki Imafuku, Yamanashi (JP); Toshiyuki Koyama, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 259 days.

(21) Appl. No.: 14/528,152

(22) Filed: Oct. 30, 2014

(65) Prior Publication Data

US 2015/0128410 A1    May 14, 2015

(30) Foreign Application Priority Data

Nov. 13, 2013  (JP) .................................. 2013-234697

(51) Int. Cl.
    *H05K 13/04* (2006.01)
(52) U.S. Cl.
    CPC .... *H05K 13/0404* (2013.01); *Y10T 29/49139* (2015.01); *Y10T 29/53183* (2015.01)
(58) Field of Classification Search
    CPC .......... H05K 13/0404; Y10T 29/49139; Y10T 29/53183
    See application file for complete search history.

(56) References Cited

U.S. PATENT DOCUMENTS

| 4,196,513 | A | * | 4/1980 | Harigane | ........... H05K 13/0452 29/741 |
| 4,744,141 | A | * | 5/1988 | Musiani | ............. H05K 13/0443 29/564.1 |
| 5,212,881 | A | * | 5/1993 | Nishitsuka | ....... G05B 19/41805 29/720 |
| 5,832,597 | A | * | 11/1998 | Yokoyama | ......... H05K 13/0404 29/564.1 |
| 5,909,914 | A | * | 6/1999 | Imai | ................... H05K 13/0404 29/564.1 |

(Continued)

FOREIGN PATENT DOCUMENTS

| CN | 102742378 A | 10/2012 |
| JP | S5875014 A | 5/1983 |

(Continued)

OTHER PUBLICATIONS

JP-OA 2013-234697 dispatched on Jan. 26, 2016 for Japanese Patent Application No. 2013-234697.

(Continued)

*Primary Examiner* — Minh Trinh
(74) *Attorney, Agent, or Firm* — Pearne & Gordon LLP

(57) ABSTRACT

Provided is a method for mounting an electronic component having a plurality of board insert type leads on a board. The method includes a holding process which chucks one of the plurality of leads of the electronic component to hold the electronic component, and an inserting process which inserts the leads of the electronic component held by the mounting head respectively into lead insert holes provided in the board.

8 Claims, 10 Drawing Sheets

(56) References Cited

U.S. PATENT DOCUMENTS

| | | | |
|---|---|---|---|
| 6,115,908 A * | 9/2000 | Inaba | H05K 13/0417 |
| | | | 29/566.3 |
| 2015/0128410 A1* | 5/2015 | Watanabe | H05K 13/0404 |
| | | | 29/837 |
| 2015/0128411 A1* | 5/2015 | Watanabe | H05K 13/0404 |
| | | | 29/837 |

FOREIGN PATENT DOCUMENTS

| | | |
|---|---|---|
| JP | 2000-261194 A | 9/2000 |
| WO | 2011-079956 A1 | 7/2011 |

OTHER PUBLICATIONS

Chinese Office Action issued in Patent Application No. CN-201410601838.6 dated Mar. 5, 2018.

* cited by examiner

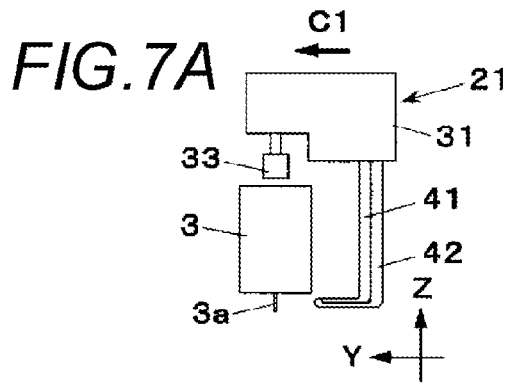
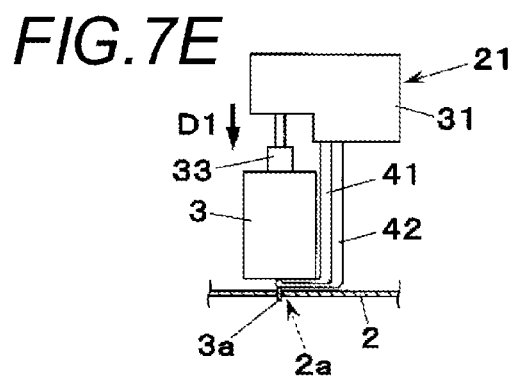
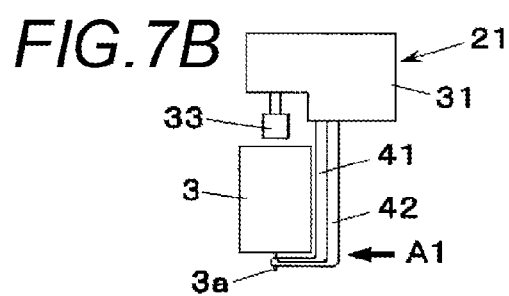
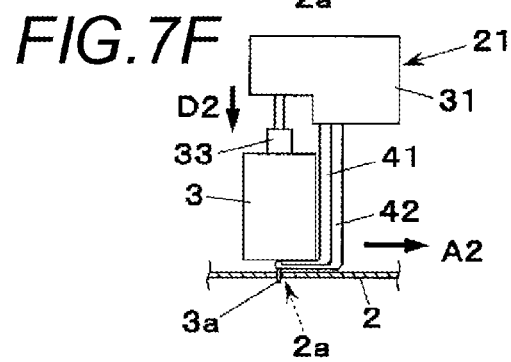
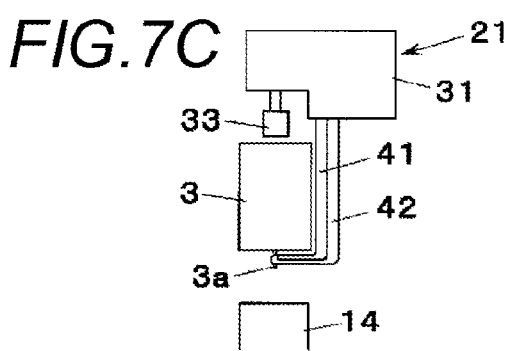
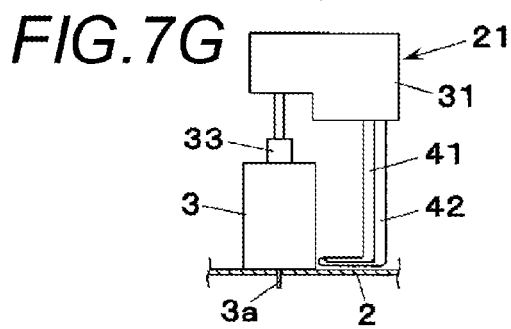
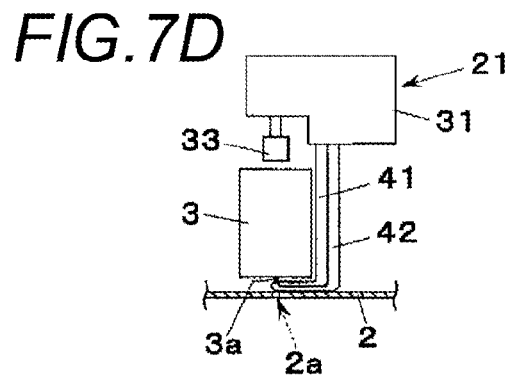
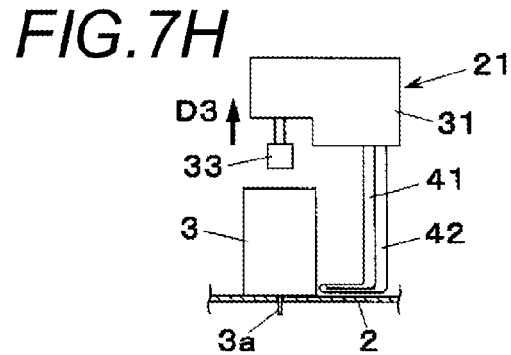

METHOD FOR MOUNTING ELECTRONIC COMPONENT

CROSS REFERENCE TO RELATED APPLICATIONS

The present application is based on and claims the benefit of Japanese patent application No. 2013-234697 filed on Nov. 13, 2013, the contents of which are incorporated by reference in its entirety.

BACKGROUND OF THE INVENTION

1. Field of the Invention

The present invention relates to an apparatus and a method for mounting an electronic component having a plurality of board insert type leads on a board.

2. Description of the Related Art

An electronic component mounting apparatus which mounts an electronic component having a plurality of board insert type leads on a board is usually formed to move a mounting head which grips a main body part (a body part) of the electronic component by a chuck member so that the leads provided in the electronic component are respectively inserted into lead insert holes provided in the board (for instance, JP-A-2000-261194).

SUMMARY OF THE INVENTION

However, since the chuck member of the usual electronic component mounting apparatus is extremely low in general-purpose property for a difference of size or form of the electronic component, kinds of electronic components which can be met by the single chuck member are restricted. Especially, since the sizes or the forms of the electronic components referred to as variant components are not standardized, the electronic component mounting apparatus which handles these electronic components as objects needs to prepare an exclusive chuck member for each of the electronic components. Accordingly, in a mounting line which treats the variant components, a problem arises that an introduction of the electronic component mounting apparatus exclusively used for the variant components does not progress in view of working cost and an operation in the mounting line yet depends on a human power.

Thus, it is an object of the present invention to provide an apparatus and a method which increase a general-purpose property for a size or a form of an electronic component and improve a working cost.

There is provided an apparatus for mounting an electronic component having a plurality of board insert type leads on a board, the apparatus including a mounting head having a chuck unit which chucks one of the plurality of leads of the electronic component to hold the electronic component, and a mounting head moving unit which moves the mounting head to insert the leads of the electronic component held by the mounting head respectively into lead insert holes provided in the board.

There is provided a method for mounting an electronic component having a plurality of board insert type leads on a board, the method including a holding process which chucks one of the plurality of leads of the electronic component by a chuck unit to hold the electronic component, and an inserting process which inserts the leads of the electronic component held in the holding process respectively into lead insert holes provided in the board.

According to the present invention, the general-purpose property for the size or the form of the electronic component can be increased and the working cost can be extremely improved.

BRIEF DESCRIPTION OF THE DRAWINGS

In the accompanying drawings:

FIG. 7A to FIG. 7H are diagrams showing a procedure for carrying out a mounting operation of the electronic component on the board by the mounting head in the one exemplary embodiment of the present invention;

DETAILED DESCRIPTION OF THE EXEMPLARY EMBODIMENTS

Figure 1:
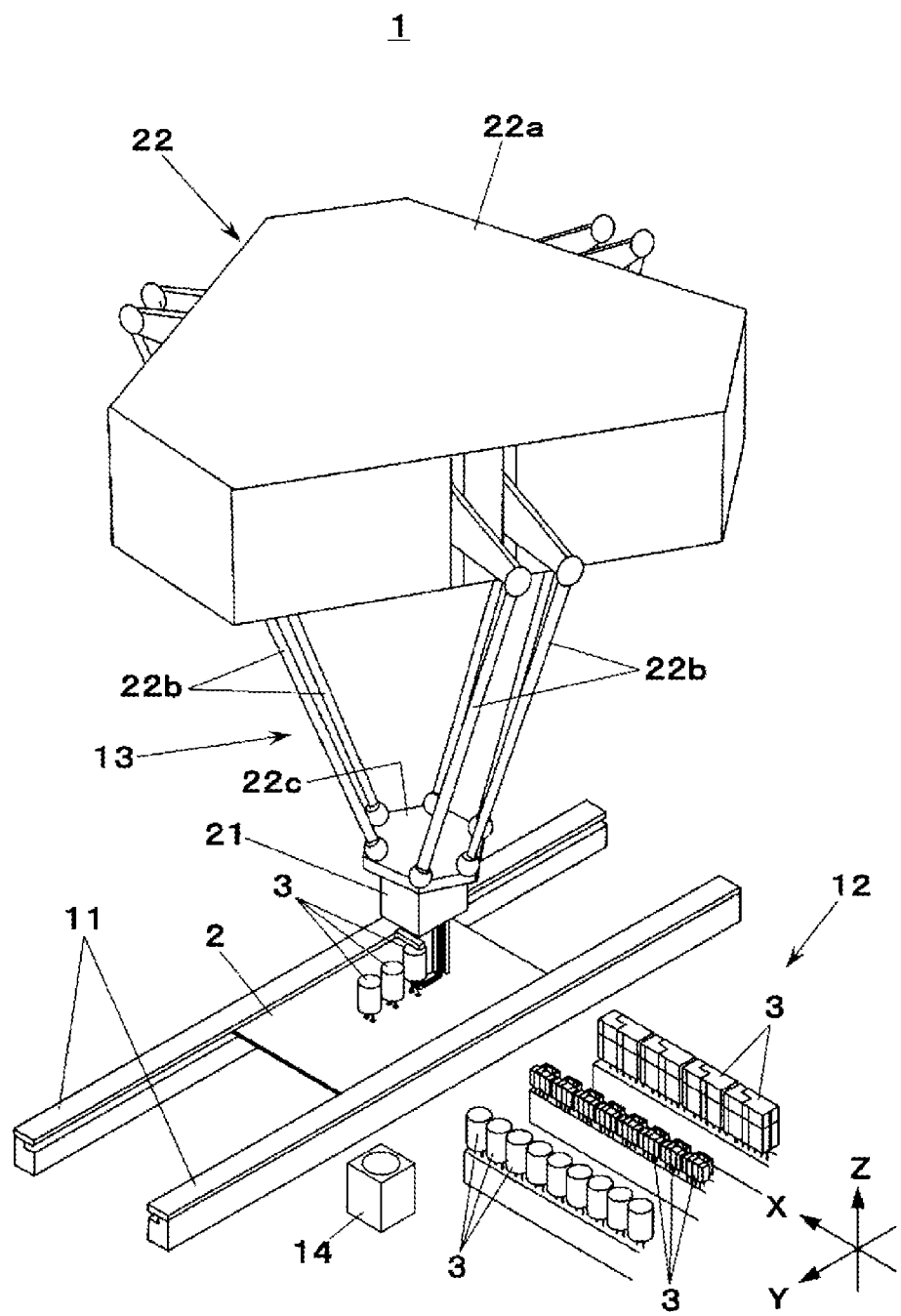
FIG. 1 is a perspective view of an electronic component mounting apparatus in one exemplary embodiment of the present invention.
Figure 2:
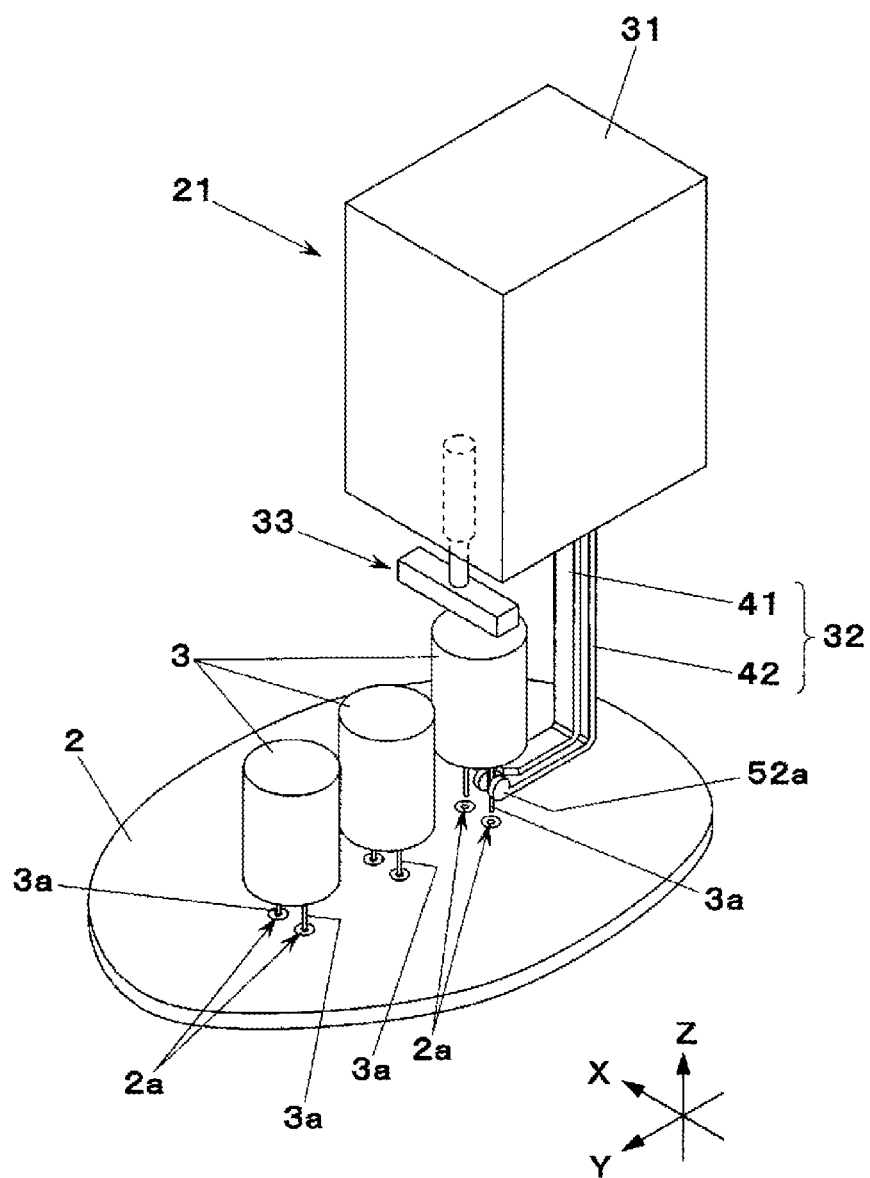
FIG. 2 is a perspective view showing a mounting head provided in the electronic component mounting apparatus in the one exemplary embodiment of the present invention together with electronic components and a board.

Now, referring to the drawings, an exemplary embodiment of the present invention will be described below. An electronic component mounting apparatus 1 shown in FIG. 1 is an apparatus which mounts an electronic component 3 on a board 2. The electronic component mounting apparatus 1 includes a board carrying conveyor 11 which conveys the board 2 and positions the board 2 in a prescribed working position, a component feeder 12 which feeds various kinds of electronic components 3, a component mounting mechanism 13 provided in an upper part of the board carrying conveyor 11 and a recognition camera 14 installed with its image pick-up visual field directed upward. As shown in FIG. 2, the electronic component 3 has a plurality of board insert type leads 3a which are extended downward. On the board 2, a plurality of lead insert holes 2a are provided so as to meet arrangements of the leads 3a of the electronic components 3 respectively.

In FIG. 1, the component mounting mechanism 13 includes a mounting head 21 and a mounting head moving mechanism 22 which moves the mounting head 21. The mounting head moving mechanism 22 includes a link rod driving mechanism 22a attached to a fixed member not shown in the drawing, a plurality of link rods 22b driven by the link rod driving mechanism 22a and a plate shaped end effecter 22c supported by the plurality of link rods 22b. The mounting head 21 is attached to a lower surface of the end effecter 22c.

The mounting head moving mechanism 22, namely, the link rod driving mechanism 22a, the link rods 22b and the end effecter 22c form what is called a parallel link robot. When the link rods 22b are driven by the link rod driving mechanism 22a, movements of the mounting head 21 attached to the end effecter 22c in directions X, Y and Z and rotating directions of rotations of the mounting head 21 on X, Y and Z axes respectively can be freely controlled. In the present exemplary embodiment, the mounting head moving mechanism 22 (the parallel link robot) formed with the link rod driving mechanism 22a, the link rods 22b and the end effecter 22c form a mounting head moving unit.

Figure 3:
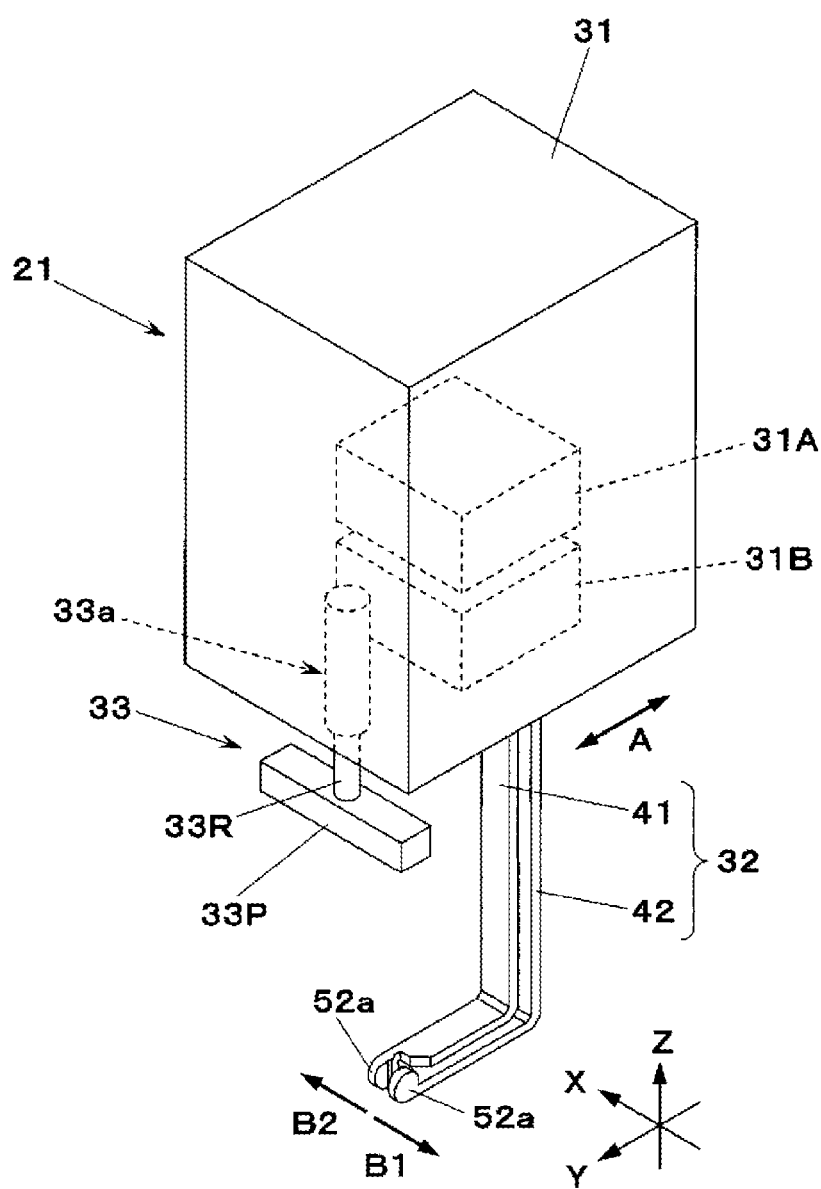
FIG. 3 is a perspective view of the mounting head in the one exemplary embodiment of the present invention.
Figure 4:
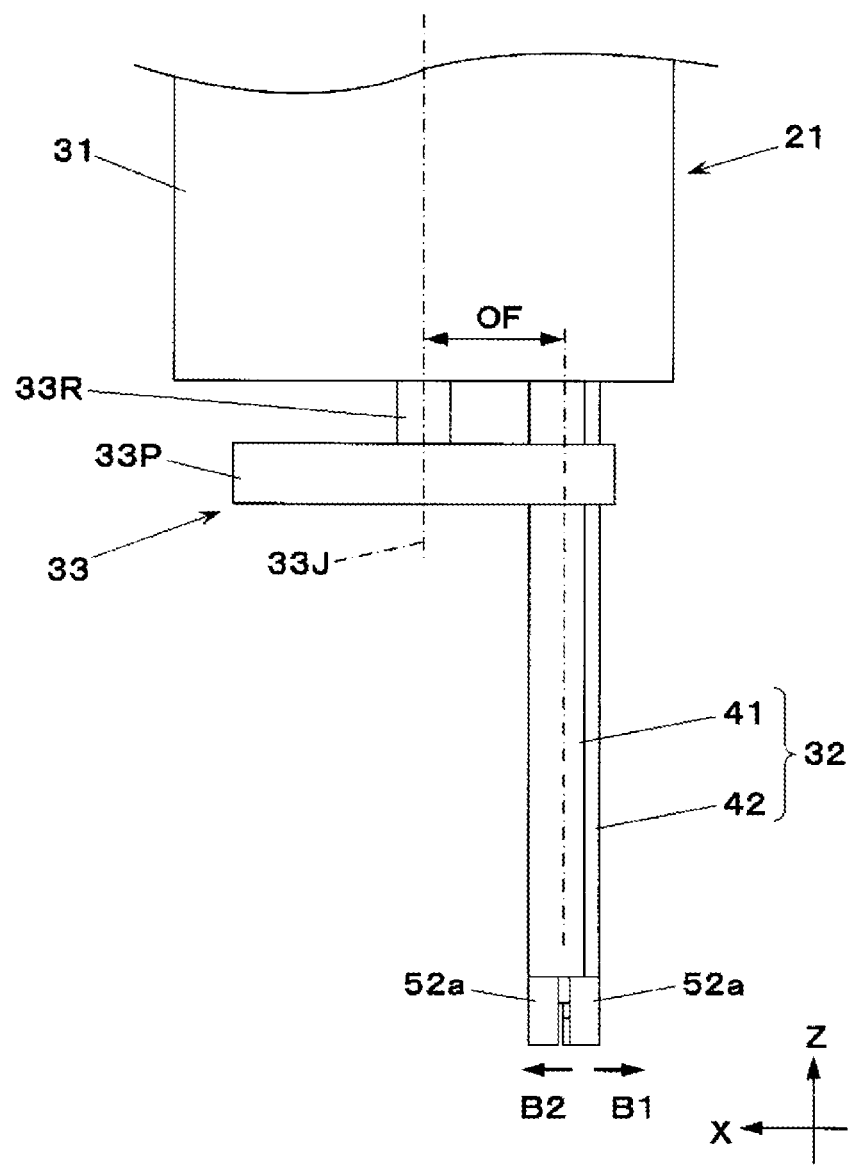
FIG. 4 is a partly enlarged front view of the mounting head in the one exemplary embodiment of the present invention.

In FIGS. 2, 3 and 4, the mounting head 21 includes a base body 31 fixed to a lower surface of the end effecter 22c, one chuck 32 extending downward from the base body 31 and a pusher 33 provided in the base body 31. The chuck 32 includes a fixed chuck member 41 and a movable chuck member 42 which are provided in parallel. The pusher 33 is formed with a pneumatic cylinder 33a having a pressing pad 33P attached to a lower end of a piston rod 33R. The pneumatic cylinder 33a operates, so that the piston rod 33R is advanced downward (an advancing operation) and the piston rod 33R is retreated upward (a retreating operation). For the convenience of explanation, the direction where the fixed chuck member 41 and the movable chuck member 42 are provided in parallel is set to an X-axis direction in the mounting head 21. Further, a direction which intersects at right angles to the X-axis direction in a horizontal plane is set to a Y-axis direction and a vertical direction is set to a Z-axis direction.

Figure 5:
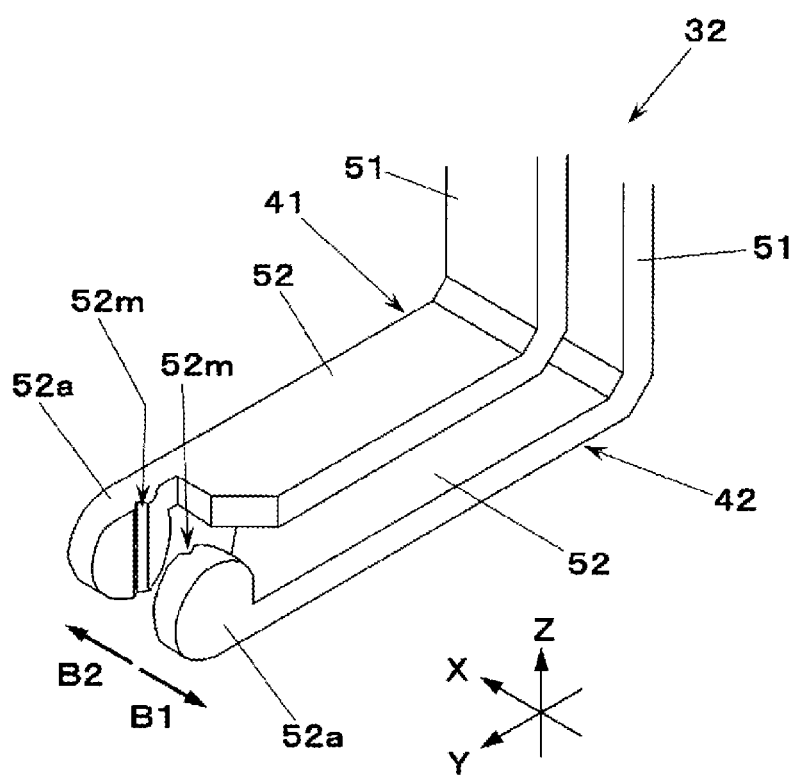
FIG. 5 is a partly enlarged perspective view of the mounting head in the one exemplary embodiment of the present invention.

In FIG. 5, the fixed chuck member 41 and the movable chuck member 42 which form the chuck 32 are respectively formed with L shaped members that have vertical parts 51 which extend downward from the base body 31 and horizontal parts 52 which extend to be bent in the Y-axis directions from lower ends of the vertical parts 51 and have grip parts 52a at ends. In FIG. 3, the chuck 32 (the fixed chuck members 41 and the movable chuck members 42) are moved in the Y-axis directions (an arrow mark A shown in FIG. 3) by a chuck moving mechanism 31A accommodated in the base body 31 and opened and closed in the X-axis directions by a chuck opening and closing mechanism 31B accommodated in the base body 31 (the movable chuck member 42 is moved in the X-axis directions relative to the fixed chuck member 41) (arrow marks B1 and B2 shown in FIG. 3, FIG. 4 and FIG. 5). In the present exemplary embodiment, the chuck 32 and the chuck opening and closing mechanism 31B form a chuck unit.

In FIG. 3 and FIG. 4, the pusher 33 is provided in such a way that a vertical central axis 33J of the piston rod 33R is located in the vicinity of a center in the X-axis direction of the mounting head 21. The chuck 32 is provided at a position where the fixed chuck member 41 is offset from the vertical central axis 33J of the piston rod 33R by an offset amount OF in one direction side of the X-axis direction (right side in the sheet in FIG. 4). The movable chuck member 42 is provided so that its grip part 52a moves outside (outside by setting the vertical central axis 33J of the piston rod 33R of the pusher 33 to a reference) the grip part 52a of the fixed chuck member 41 in the X-axis directions.

In FIG. 3, FIG. 4 and FIG. 5, the grip part 52a of the fixed chuck member 41 is opposed to the grip part 52a of the movable chuck member 42 in the X-axis direction. When the grip part 52a of the movable chuck member 42 moves so as to be separated from the grip part 52a of the fixed chuck member 41, the chuck 32 is opened (arrow marks B1 shown in FIG. 3, FIG. 4 and FIG. 5). When the grip part 52a of the movable chuck member 42 moves so as to come close to the grip part 52a of the fixed chuck member 41, the chuck 32 is closed (arrow marks B2 shown in FIG. 3, FIG. 4 and FIG. 5). As shown in FIG. 5, in the grip part 52a of the fixed chuck member 41 and the grip part 52a of the movable chuck member 42 respectively, V shaped groove parts 52m are provided to extend in the Z-axis direction. Thus, the leads 3a of the electronic component 3 can be assuredly chucked.

Figure 6:
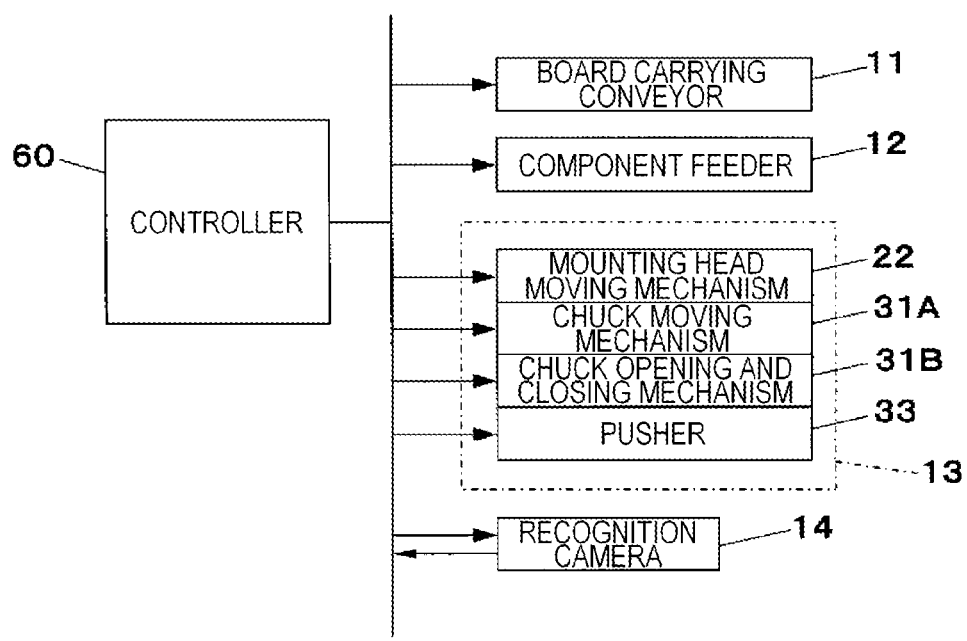
FIG. 6 is a block diagram showing a control system of the electronic component mounting apparatus in the one exemplary embodiment of the present invention.

In FIG. 6, a control of a conveying and positioning operation of the board 2 by the board carrying conveyor 11, a feed control of the electronic components 3 by the component feeder 12 and a moving control of the mounting head 21 by the mounting head moving mechanism 22 are carried out by a controller 60 provided in the electronic component mounting apparatus 1. The moving operation of the chuck 32 provided in the mounting head 21 in the Y-axis direction is carried out by controlling operation of the chuck moving mechanism 31A through the controller 60. The opening and closing operation of the chucks 32 is carried out by controlling operation of the chuck opening and closing mechanism 31B through the controller 60. Further, the controller 60 also controls the downward advancing operation and the upward retreating operation of the pusher 33 and an image pick-up operation by the recognition camera 14. Further, the controller 60 recognizes the lead 3a in accordance with image data obtained by the recognition camera 14 to detect a position of the lead 3a of the electronic component 3 held by the mounting head 21. In the present exemplary embodiment, a function of the recognition camera 14 and the controller 60 for detecting the position of the lead 3a serves as a recognizing unit.

Now, a procedure (an electronic component mounting method), will be described below, for carrying out a mounting operation of the electronic component 3 on the board 2 by the electronic component mounting apparatus 1 with the above-described structure. The controller 60 carries out the mounting operation of the electronic components 3 on the board 2 by operating structure component parts respectively such as the board carrying conveyor 11, the component feeder 12 and the mounting head moving mechanism 22.

In the mounting operation of the electronic parts 3 on the board 2, the board carrying conveyor 11 is operated to convey and position the board 2 in the prescribed working position. Then, the component feeder 12 feeds the electronic components 3, the mounting head 21 moves to an upper part of the component feeder 12, and then, the electronic component 3 is held by the chuck 32.

When the mounting head 21 holds the electronic component 3, initially, the mounting head comes close to the electronic component 3 from a direction which intersects at right angles to a direction where the leads 3a of the electronic component 3 are arranged (an arrow mark C1 shown in FIG. 7A) and the pusher 33 is located above the electronic component 3 (FIG. 7A). Then, the chuck 32 is moved so as to come close to the electronic component 3 (an arrow mark A1 shown in FIG. 7B). One of the plurality of leads 3a provided in the electronic component 3 is chucked by the chuck 32 to hold the electronic component 3 (FIG. 7B, a holding process).

Figure 8:
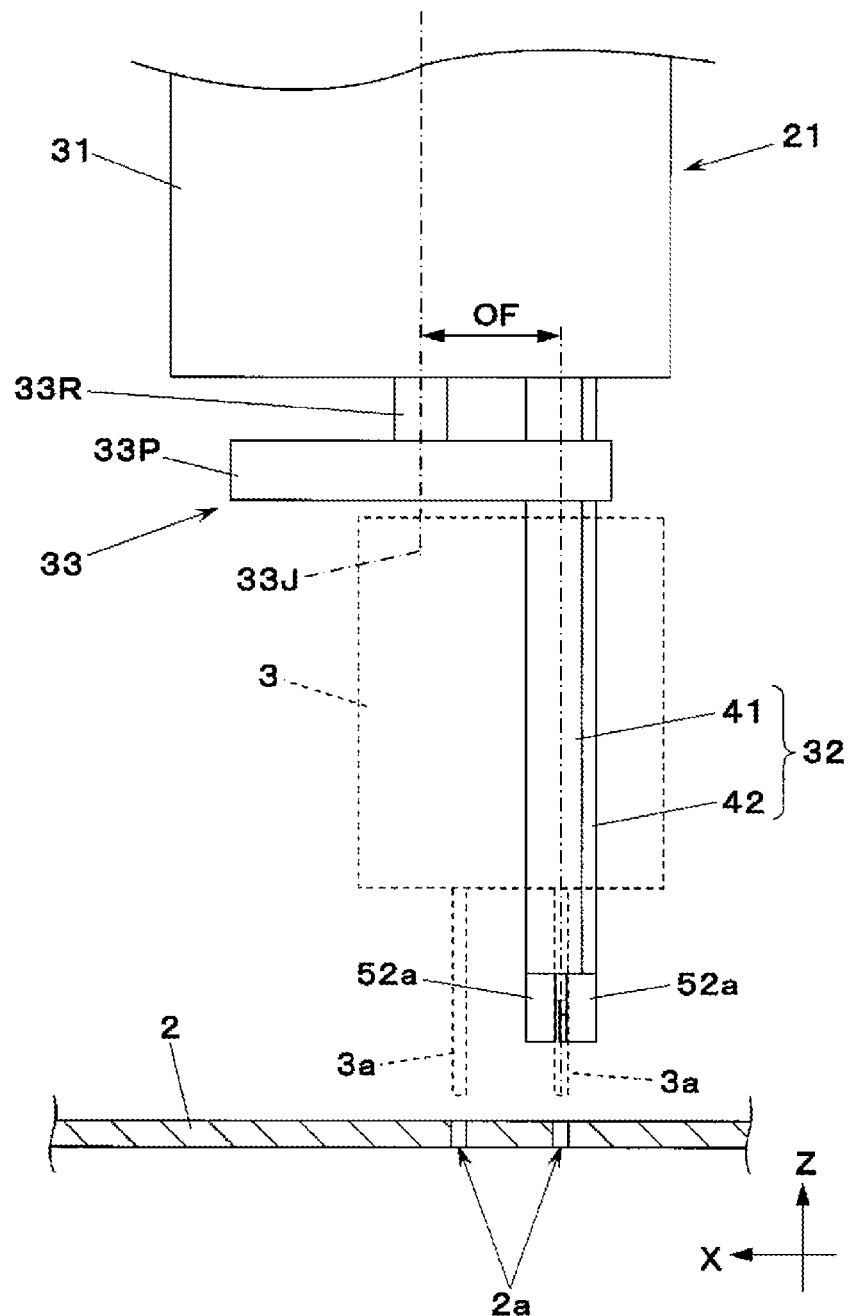
FIG. 8 is a front view showing the mounting head in the one exemplary embodiment of the present invention together with the electronic component and the board.
Figure 9:
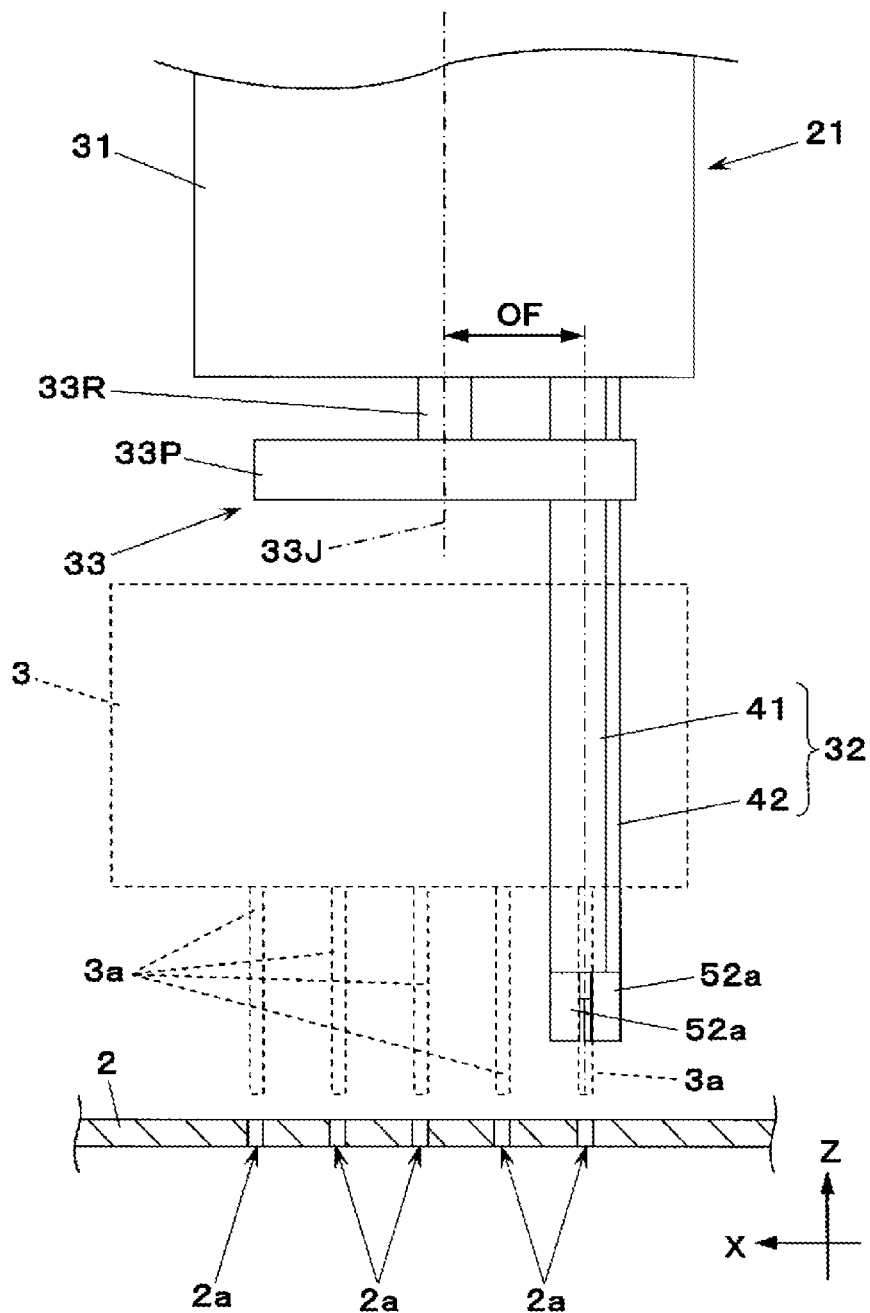
FIG. 9 is a front view showing the mounting head in the one exemplary embodiment of the present invention together with the electronic component and the board.

In the above-described holding process, the mounting head 21 chucks one lead 3a located at an offset position toward the side of the chuck 32 from the central part of the electronic component 3 (a central part in the direction where the leads 3a are arranged). As described above, since the piston rod 33R. of the pusher 33 is located separately in the X-axis direction (offset in the X-axis direction) from the chuck 32, under a state that the one lead 3a located at an offset position toward the side of the chuck 32 from the central part of the electronic component 3 are chucked by the chuck 32, the pusher 33 can be located above the central part of the electronic component 3. FIG. 8 shows a state that the electronic component 3 in which the number of the leads 3a is two is held by the mounting head 21. FIG. 9 shows a state that the electronic component 3 in which the number of the leads 3a is three or more (here, five) is held by the mounting head 21.

In the above-described holding method of the electronic component 3, a fact is paid attention that even when the size or form of the electronic component 3 is changed, the form of the board insert type lead 3a is little changed. Thus, when one lead of the plurality of leads 3a of the electronic component 3 is chucked by the chuck 32, the electronic component 3 can be assuredly held. As shown in FIG. 8 and FIG. 9, in the above-described holding process, when the lead 3a located at the most distant positions from the central part of the electronic component 3 is chucked by the chuck 32, even if a space between the fixed chuck member 41 and the movable chuck member 42 of the chuck 32 which is opened is larger than a space between the adjacent leads 32a, the lead 3a can be chucked.

When the mounting head 21 holds the electronic component 3 by the chuck 32, the electronic component 3 is located above the recognition camera 14 (FIG. 7C). Then, the recognition camera 14 picks up an image of the lead 3a of the electronic component 3 and sends image data obtained by an image pick-up operation to the controller 60. The controller 60 recognizes the leads 3a of the electronic component 3 respectively held in the holding process from the image data (a recognizing process). Here, the controller 60 recognizes images of all the leads 3a of the electronic component 3 to grasp their positions. However, since the position of the lead 3a chucked by the chuck 32 can be grasped from the position of the chuck 32 which chucks the lead 3a, in the recognizing process, other leads 3a than the lead 3a which is chucked by the chuck 32 may be merely recognized to grasp the positions. Thus, a processing time required for grasping the positions of the leads 3a respectively of the electronic component 3 can be shortened.

The controller 60 operates the mounting head moving mechanism 22 in accordance with the positions of the leads 3a grasped in the recognizing process to carry out an operation for inserting the leads 3a of the electronic component 3 into the lead insert holes 2a. Namely, the mounting head 21 positions the leads 3a of the electronic component 3 on the corresponding lead insert holes 2a respectively provided in the board 2 (a positioning process) and moves to the board 2 side to insert ends of the leads 3a into the lead insert holes 2a (an inserting process, FIG. 7D). After that, the pusher 33 advances the piston rod 33R downward to press the electronic component 3 toward the board 2 by the pressing pad 33P (an arrow mark D1 shown in FIG. 7E). Thus, the leads 3a of the electronic component 3 are respectively pressed into the lead insert holes 2a (a pressing process). At this time, the leads 3a are slid downward along the above-described groove parts 52m provided in the chucks 32.

In parallel with the pressing process by the pusher 33, the chuck 32 is retreated from between the electronic component 3 and the board 2. Specifically, the chuck 32 is opened with a little delay from a timing when the pusher 33 presses the electronic component 3, and then, moves toward a direction where the chuck 32 is separated from the electronic component 3 (an arrow mark A2 shown in FIG. 7F). After the chuck 32 is retreated, the pusher 33 continuously presses the lead 3a (an arrow mark D2 shown in FIG. 7F) to push the lead 3a into the lead insert hole 2a to a desired depth.

When the pusher 33 pushes the lead 3a into the lead insert hole 2a in such a manner as described above (FIG. 7G), the pusher retreats the piston rod 33R upward to separate from the electronic component 3 (an arrow mark D3 shown in FIG. 7H). Thus, a mounting operation of the electronic component 3 on the board 2 is finished (FIG. 7H). As described above, in the present exemplary embodiment, the pusher 33 serves as a pressing unit which presses the electronic component 3 whose lead 3a is inserted into the lead insert hole 2a toward the board 2 side.

When the electronic component 3 has two leads 3a, a mounting operation of the electronic component 3 may be carried out in a procedure as described below.

Figure 10A:
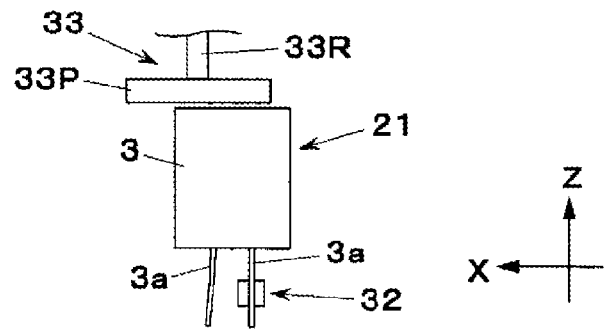
FIG. 10A to FIG. 10D are diagrams showing a procedure for carrying out a mounting operation of the electronic component on the board by the mounting head in the one exemplary embodiment of the present invention.
Figure 10B:
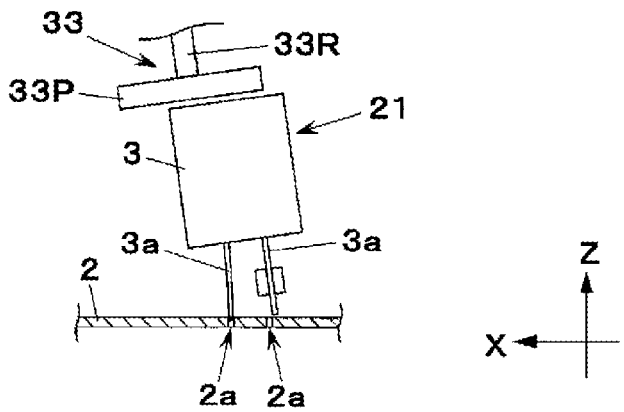
Figure 10C:
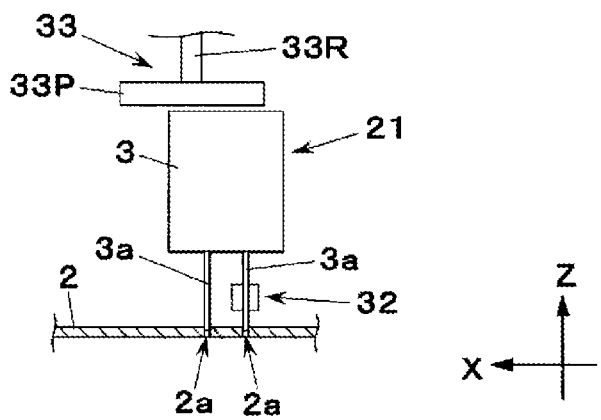
Figure 10D:
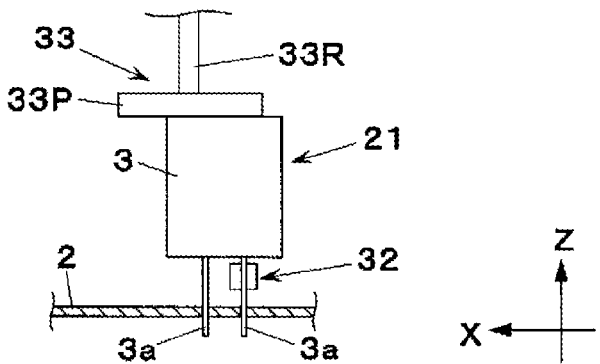

In the above positioning process, the mounting head moving mechanism 22 inserts a lead 3a which is not chucked into the lead insert hole 2a prior to a lead 3a which has been chucked by the chuck 32 among two leads 3a provided in the electronic component 3 (procedure from FIG. 10A to FIG. 10B), and then inserts the lead 3a which has been chucked by the chuck 32 into the lead insert hole 2a (FIG. 10C). After that, the pusher 33 advances the pressing pad 33P downward to press the electronic component 3 toward the board 2 (FIG. 10D). According to this procedure, in addition to a case where the two leads 3a are in parallel to each other, even if the two leads 3a are not in parallel because one of the two leads 3a are flexed as shown in FIG. 10A, it is possible to surely insert the two leads 3a into the lead insert holes 2a.

As described above, in the electronic component mounting apparatus 1 (the electronic component mounting method) of the present exemplary embodiment, the fact is paid attention that even when the size or form of the electronic component 3 is changed, the form of the board insert type lead 3a is little changed. Thus, one lead of the plurality of leads 3a of the electronic component 3 is chucked by the chuck 32 to hold the electronic component 3. Accordingly, the electronic component 3 can be held irrespective of its size or form, a general-purpose property of the electronic component mounting apparatus 1 can be improved and a working cost can be extremely improved.

The present invention is not limited to the configuration as set forth in the embodiment described as above, but various modifications can be made. For example, the mounting head moving mechanism 22 may be a vertical movement type moving mechanism, a multi-joint robot, or the like.

The electronic component mounting apparatus and the electronic component mounting method are provided in which the general-purpose property for the size or the form of the electronic component is increased and the working cost is extremely improved.

What is claimed is:

1. A method for mounting an electronic component having a plurality of board insert type leads on a board, the method comprising:
   a providing process which provides a chuck unit including a fixed chuck member having a grip part and a movable chuck member having a grip part opposed to the grip part of the fixed chuck member;
   a holding process which chucks only one of the plurality of leads of the electronic component by the chuck unit by moving the movable chuck member toward the fixed chuck member while the fixed chuck member is fixed, wherein any other ones of the plurality of leads of the electronic component are not chucked by the chuck unit in the holding process; and
an inserting process which inserts the leads of the electronic component held in the holding process respectively into lead insert holes provided in the board,
wherein the holding process comprises positioning one of the leads between the grip part of the movable chuck member and the grip part of the fixed chuck member, and chucking the one of the leads by moving the grip part of the movable chuck member toward the grip part of the fixed chuck member.

2. The method according to claim 1, further comprising:
a recognizing process which recognizes the leads of the electronic component held by a mounting head; and
a recognition result obtaining process of obtaining a recognition result of the leads after the recognizing process, wherein
the leads of the electronic component are inserted into the lead insert holes in the inserting process based on the recognition result of the leads.

3. The method according to claim 2, wherein
unchucked leads other than the lead chucked by the chuck unit are recognized in the recognizing process among the plurality of leads of the electronic component.

4. The method according to claim 1, wherein
the plurality of leads include two leads, and an unchucked lead which is not chucked by the chuck unit is inserted into the lead insert hole prior to a lead which has been chucked by the chuck unit in the inserting process among the two leads provided in the electronic component.

5. The method according to claim 1,
further comprising positioning the chuck unit at a position offset by a predetermined amount from a center of the mounting head.

6. The method according to claim 1, further comprising:
a pressing process which presses the electronic component, whose leads are inserted into the lead insert holes in the inserting process, toward a side of the board.

7. The method according to claim 6, further comprising positioning the chuck unit at a position offset by a predetermined amount from a vertical central axis of a pressing unit used in the pressing process.

8. The method according to claim 1,
wherein when chucking the one of the plurality of leads of the electronic component, the movable chuck member moves toward the fixed chuck member in a direction perpendicular to a direction of extension of the one of the plurality of leads of the electronic component.

\* \* \* \* \*